United States Patent
Zhang et al.

(10) Patent No.: US 9,779,956 B1
(45) Date of Patent: Oct. 3, 2017

(54) HYDROGEN ACTIVATED ATOMIC LAYER ETCHING

(71) Applicant: Lam Research Corporation, Fremont, CA (US)

(72) Inventors: Xin Zhang, Los Altos, CA (US); Alan Jensen, Tracy, CA (US); Gerardo Delgadino, Milpitas, CA (US); Daniel Le, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/425,899

(22) Filed: Feb. 6, 2017

(51) Int. Cl.
*H01L 21/302* (2006.01)
*H01L 21/461* (2006.01)
*H01L 21/3065* (2006.01)
*H01L 21/67* (2006.01)

(52) U.S. Cl.
CPC .... *H01L 21/3065* (2013.01); *H01L 21/67225* (2013.01)

(58) Field of Classification Search
USPC ....................................................... 438/723
See application file for complete search history.

(56) References Cited

U.S. PATENT DOCUMENTS

2016/0196984 A1* 7/2016 Lill ....................... C23C 16/458
438/694

\* cited by examiner

*Primary Examiner* — Roberts Culbert
(74) *Attorney, Agent, or Firm* — Beyer Law Group LLP (57) ABSTRACT

A method for selectively etching SiO and SiN with respect to SiGe or Si of a structure is provided. A plurality of cycles of atomic layer etching is provided, where each cycle comprises a fluorinated polymer deposition phase and an activation phase. The fluorinated polymer deposition phase comprises flowing a fluorinated polymer deposition gas comprising a fluorocarbon gas, forming the fluorinated polymer deposition gas into a plasma, which deposits a fluorocarbon polymer layer on the structure, and stopping the flow of the fluorinated polymer deposition gas. The activation phase comprises flowing an activation gas comprising an inert bombardment gas and $H_2$, forming the activation gas into a plasma, wherein the inert bombardment gas activates fluorine in the fluorinated polymer which with the plasma components from $H_2$ cause SiO and SiN to be selectively etched with respect to SiGe and Si, and stopping the flow of the activation gas.

18 Claims, 6 Drawing Sheets

HYDROGEN ACTIVATED ATOMIC LAYER ETCHING

BACKGROUND

The disclosure relates to a method of forming semiconductor devices on a semiconductor wafer. More specifically, the disclosure relates to etching silicon oxide and silicon nitride in forming semiconductor devices.

In forming semiconductor devices, features may be etched where silicon oxide and silicon nitride are etched.

SUMMARY

To achieve the foregoing and in accordance with the purpose of the present disclosure, a method for selectively etching SiO and SiN with respect to SiGe and Si of a structure in a plasma processing chamber is provided. A plurality of cycles of atomic layer etching is provided, where each cycle comprises a fluorinated polymer deposition phase and an activation phase. The fluorinated polymer deposition phase comprises flowing a fluorinated polymer deposition gas comprising a fluorocarbon gas into the plasma processing chamber, forming the fluorinated polymer deposition gas into a plasma, which deposits a fluorocarbon polymer layer on the structure, and stopping the flow of the fluorinated polymer deposition gas into the plasma processing chamber. The activation phase comprises flowing an activation gas comprising an inert bombardment gas and $H_2$ into the plasma processing chamber, forming the activation gas into a plasma, wherein the inert bombardment gas activates fluorine in the fluorinated polymer which with the plasma components from $H_2$ causes SiO and SiN to be selectively etched with respect to SiGe and Si, and stopping the flow of the activation gas into the plasma processing chamber. The depositions and activation phase may comprise several steps where conditions are changed. Similar results can be obtained by replacing $H_2$ by gases containing Hydrogen like $NH_3$ for example.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
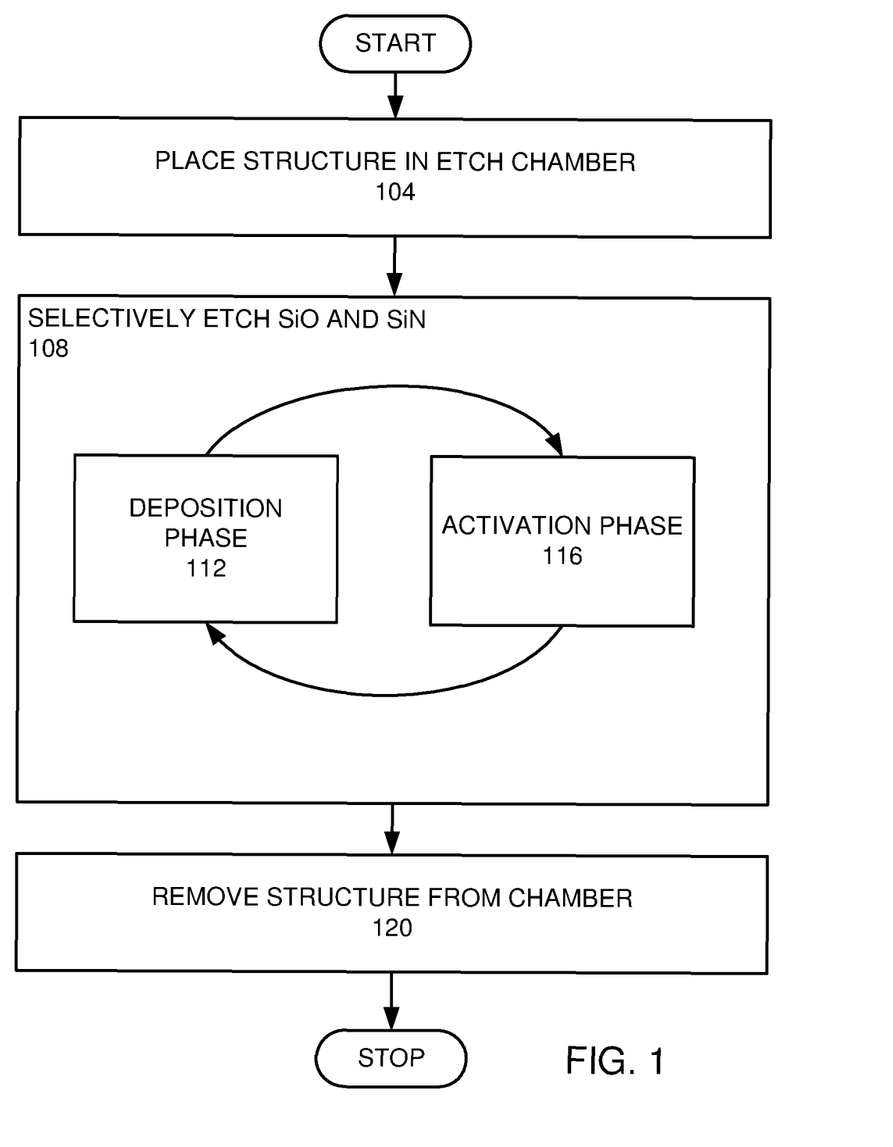
FIG. 1 is a high level flow chart of an embodiment.
Figure 2:
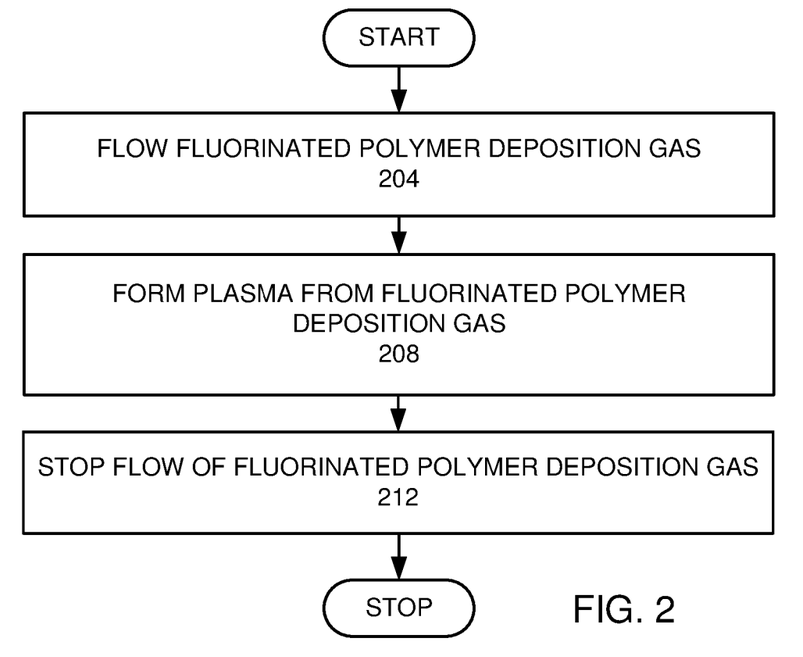
FIG. 2 is a more detailed flow chart of the fluorinated polymer deposition phase.
Figure 3:
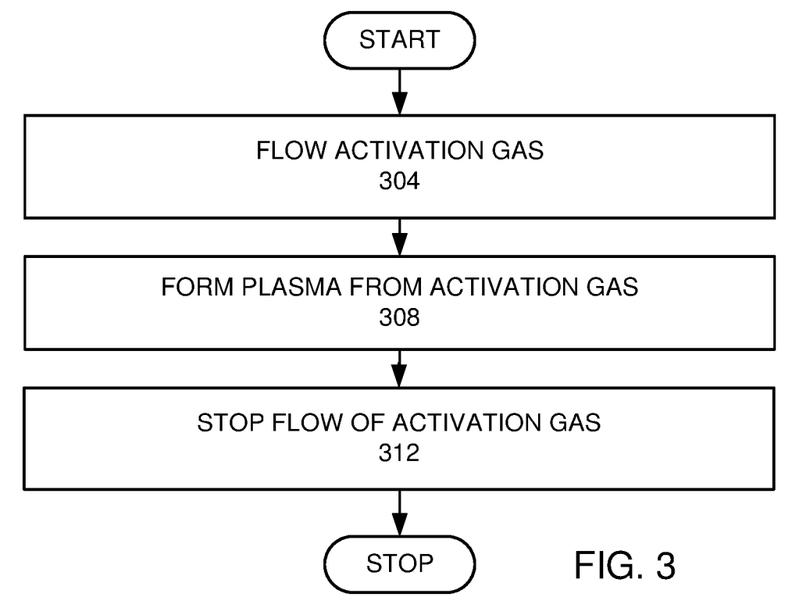
FIG. 3 is a more detailed flow chart of the activation phase.

FIG. 1 is a high level flow chart of an embodiment. In this embodiment, a substrate with a structure, such as a stack, is placed in a plasma processing chamber (step 104). A cyclical atomic layer etching is provided (step 108). Each cycle of the atomic layer etching process comprises a fluorinated polymer deposition phase (step 112) and an activation phase (step 116). The substrate with the structure is removed from the plasma processing chamber (step 120). FIG. 2 is a more detailed flow chart of fluorinated polymer deposition phase (step 112). A fluorinated polymer deposition gas is flowed into the plasma processing chamber (step 204). The fluorinated polymer deposition gas is formed into a plasma, which deposits fluorocarbon polymer on the structure (step 208). The flow of the fluorinated polymer deposition gas is stopped (step 212). FIG. 3 is a more detailed flow chart of activation phase (step 116). An activation gas is flowed into the plasma processing chamber, where the activation gas comprises an inert bombardment gas and $H_2$ (step 304). The activation gas is formed into a plasma, which activates fluorine in the fluorinated polymer which with components from $H_2$ causes SiO and SiN to be selectively etched with respect to SiGe and Si (step 308). In the specification and claims SiGe and Si includes doped and undoped SiGE and Si. The flow of the activation gas is stopped (step 312).

EXAMPLE

Figure 4A:
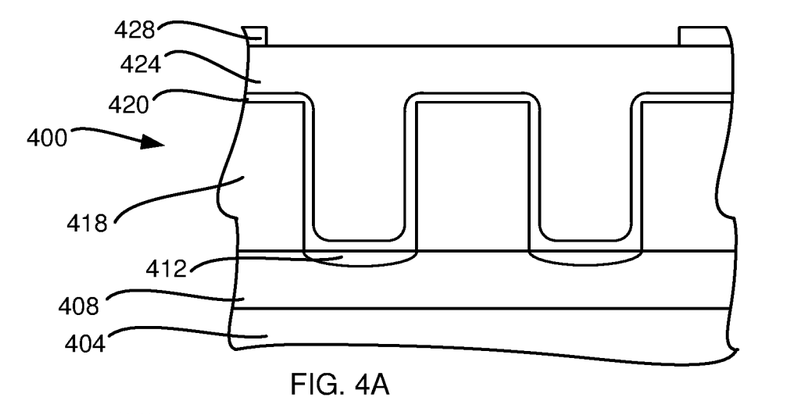
FIGS. 4A-D are schematic cross-sectional views of a structure processed according to an embodiment.

In an example, a substrate with a structure is placed in a plasma processing chamber (step 104). FIG. 4A is a schematic cross-sectional view of a structure 400, such as a stack, with a silicon substrate 404, under a silicon layer 408, with 412, and gate structures 418. The gate structures are 418 are metallic gate structures. A coated etch stop layer (CESL) 420 of SiN has been conformally deposited over the gate structures 418 and contact structures 412. A dielectric layer 424 of SiO is over the CESL 420. A hardmask 428 is formed over the dielectric layer 424.

Figure 5:
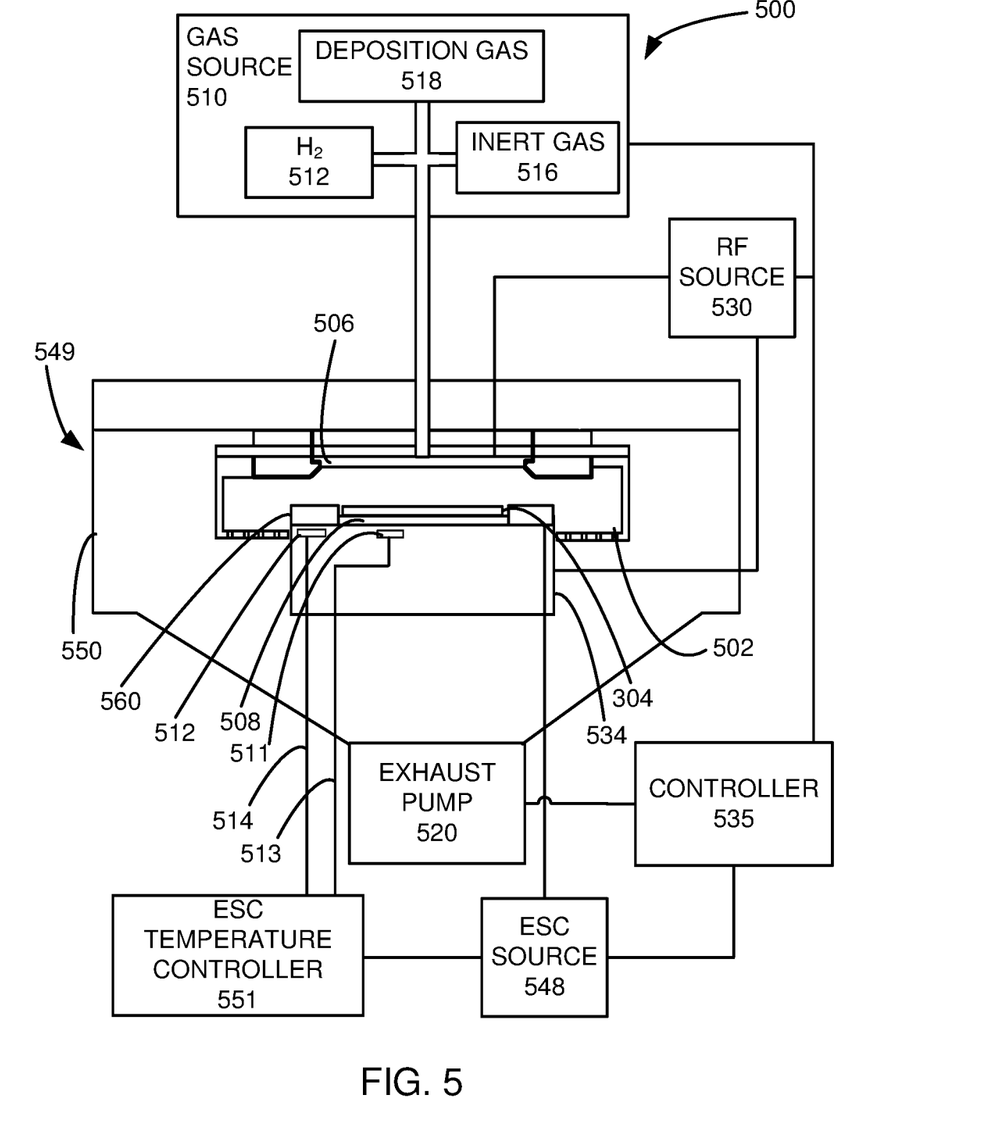
FIG. 5 is a schematic view of a plasma processing chamber that may be used in an embodiment.

FIG. 5 is a schematic view of a plasma processing chamber that may be used in an embodiment. In one or more embodiments, the plasma processing system 500 comprises a gas distribution plate 506 providing a gas inlet and an electrostatic chuck (ESC) 508, within a processing chamber 549, enclosed by a chamber wall 550. Within the processing chamber 549, the substrate 404 is positioned on top of the ESC 508. The ESC 508 may provide a bias from the ESC source 548. A gas source 510 is connected to the plasma processing chamber 549 through the distribution plate 506. In this embodiment, the gas source 510 comprises a $H_2$ gas source 512, an inert bombardment gas source 516, and a deposition gas sources 518. The gas source 510 may have additional gas sources. Each gas source may comprise multiple gas sources. An ESC temperature controller 551 is connected to the ESC 508, and provides temperature control of the ESC 508. In this example, a first connection 513 provides power to an inner heater 511 for heating an inner zone of the ESC 508 and a second connection 514 provides power to an outer heater 512 for heating an outer zone of the ESC 508. An RF source 530 provides RF power to a lower electrode 534 and an upper electrode, which in this embodiment is the gas distribution plate 506. In a preferred embodiment, 2 MHz, 60 MHz, and optionally, 27 MHz power sources make up the RF source 530 and the ESC source 548. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments, such as in another embodiment the upper electrodes may be grounded A controller 535 is controllably connected to the RF source 530, the ESC source 548, an exhaust pump 520, and the etch gas source 510. An example of such a plasma processing chamber is the Exelan Flex™ etch system manufactured by Lam Research Corporation of Fremont, Calif. The process chamber can be a CCP (capacitive coupled plasma) reactor or an ICP (inductive coupled plasma) reactor.

Figure 6:
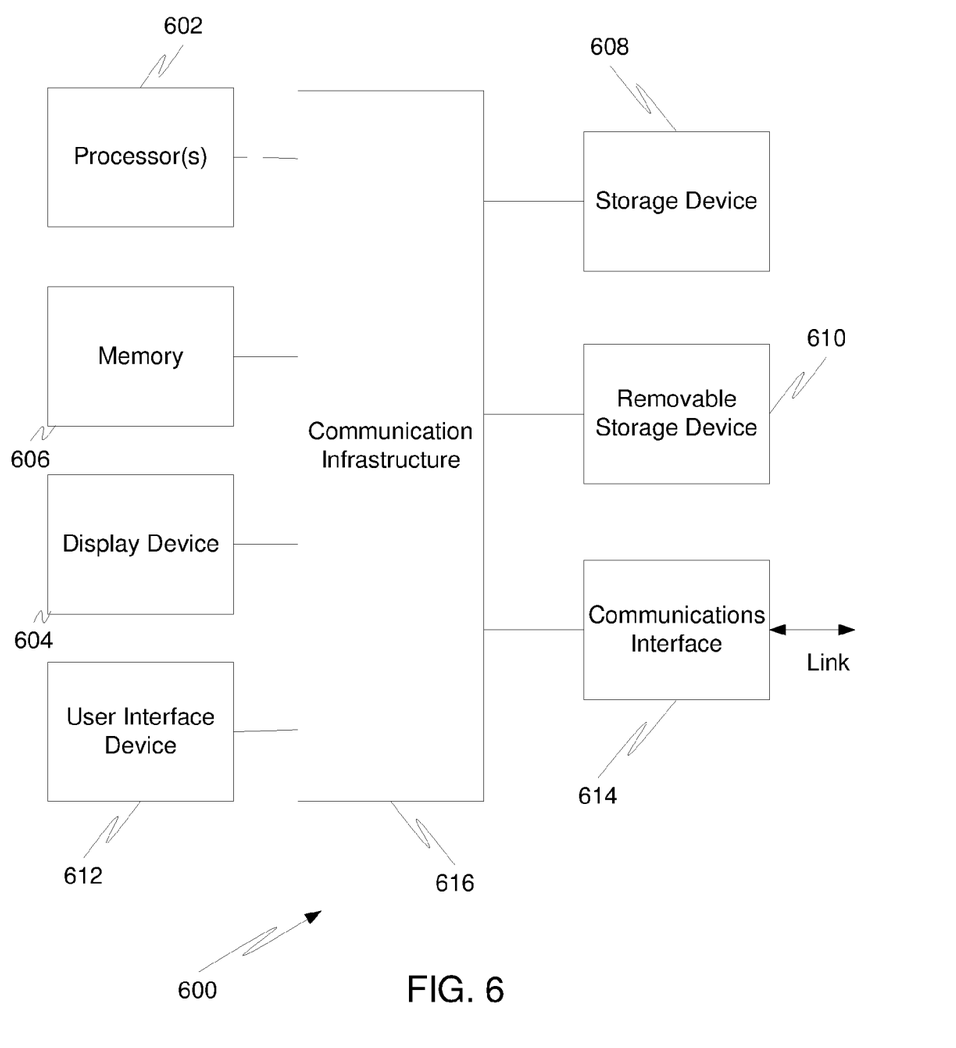
FIG. 6 is a schematic view of a computer system that may be used in practicing an embodiment.

FIG. 6 is a high level block diagram showing a computer system 600, which is suitable for implementing a controller 535 used in embodiments. The computer system may have many physical forms ranging from an integrated circuit, a printed circuit board, and a small handheld device, up to a huge super computer. The computer system 600 includes one or more processors 602, and further can include an electronic display device 604 (for displaying graphics, text, and other data), a main memory 606 (e.g., random access memory (RAM)), storage device 608 (e.g., hard disk drive), removable storage device 610 (e.g., optical disk drive), user interface devices 612 (e.g., keyboards, touch screens, keypads, mice or other pointing devices, etc.), and a communication interface 614 (e.g., wireless network interface). The communication interface 614 allows software and data to be transferred between the computer system 600 and external devices via a link. The system may also include a communications infrastructure 616 (e.g., a communications bus, cross-over bar, or network) to which the aforementioned devices/modules are connected.

Information transferred via communications interface 614 may be in the form of signals such as electronic, electromagnetic, optical, or other signals capable of being received by communications interface 614, via a communication link that carries signals and may be implemented using wire or cable, fiber optics, a phone line, a cellular phone link, a radio frequency link, and/or other communication channels. With such a communications interface, it is contemplated that the one or more processors 602 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

After the structure 400 with the substrate 404 has been placed into the plasma processing chamber 549, cyclical atomic layer etching is provided (step 108). Each cycle of the atomic layer etching process comprises a fluorinated polymer deposition phase (step 112) and an activation phase (step 116). FIG. 2 is a more detailed flow chart of fluorinated polymer deposition phase (step 112). A fluorinated polymer deposition gas is flowed into the plasma processing chamber (step 204). In this embodiment, the flowing the fluorinated polymer deposition gas flows between 2 to 20 sccm of $C_4F_6$, 2 to 20 sccm $O_2$, 10 to 200 sccm CO, and 100 to 1000 sccm Ar. The fluorinated polymer deposition gas is formed into a plasma, which deposits fluorocarbon polymer on the structure (step 208). In this embodiment, 30-200 Watts of RF power is provided at 27 MHz and 30-200 Watts of RF power is provided at 60 MHz. A bias ranging from −30V to −200V volts is provided to accelerate plasma components to the structure 400 to provide the deposition. The flow of the fluorinated polymer deposition gas is stopped (step 212) after 2 to 20 seconds.

Figure 4B:
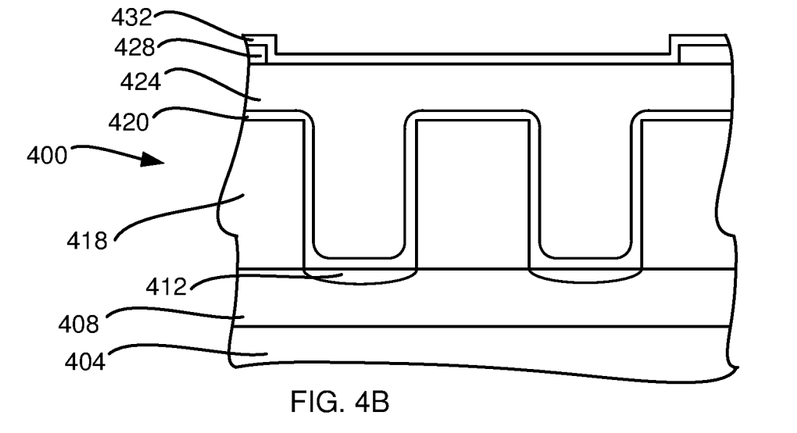

FIG. 4B is a schematic cross-sectional view of a structure 400 after the fluorinated polymer deposition phase is completed. A thin conformal layer or coating of fluorinated polymer 432 is deposited on the structure 400. The coating of fluorinated polymer 432 is not drawn to scale, but is drawn thicker to better facilitate understanding. In this embodiment, main objective of this phase is not to etch, but to deposits the fluorinated polymer coating 432, in some cases, etch of the substrate can be observed during the deposition phase FIG. 3 is a more detailed flow chart of activation phase (step 116). An activation gas is flowed into the plasma processing chamber, where the activation gas comprises one or more inert bombardment gases and $H_2$ (step 304). In this example, the activation gas is 100-800 sccm Ar and 10-200 sccm $H_2$. The activation gas is formed into a plasma, which activates fluorine in the fluorinated polymer, which with components from $H_2$ cause SiO and SiN to be selectively etched with respect to SiGe or Si or doped Si (step 308). In this embodiment, 50-200 Watts of RF power is provided at 27 MHz and 60-200 Watts of RF power is provided at 60 MHz. A bias of −200 volts is provided to accelerate plasma components to the structure 400 to cause activation. The flow of the activation gas is stopped (step 312) after 3 to 8 seconds.

Figure 4C:
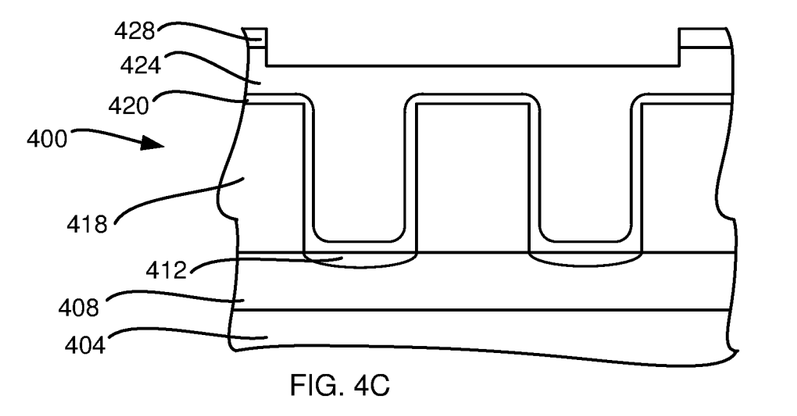

FIG. 4C is a schematic cross-sectional view of a structure 400 after the activation phase is completed. The plasma generated from the inert bombardment gas activates the fluorine in the fluorinated polymer, which along with the plasma components from $H_2$ cause part of the dielectric layer 420 to be etched. A layer of the dielectric layer 424 is shown as being etch away.

Figure 4D:
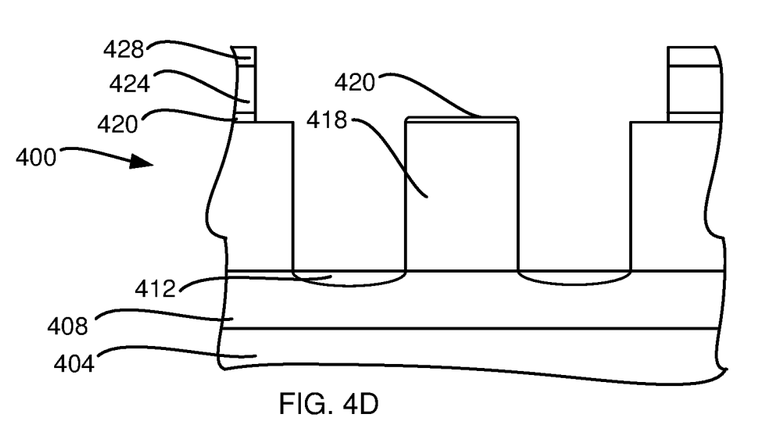

The cyclical process is repeated many times. In this example, the process is repeated from 10 to 20 times. FIG. 4D is a schematic cross-sectional view of a structure 400 after the atomic layer etch has been performed for over 10 cycles. The atomic layer etch selectively etched the SiO and SiN layers with respect to the gate structures 418, the silicon layer 408, and the SiGe or Si contact structures 412. In this example, a layer of the SiN 420 formed over the center gate structure 418 remains. This is because the atomic layer etching of SiN is aspect ratio dependent, in that regions of SiN with lower height to width aspect ratios etch SiN more slowly and because the fluorinated polymer deposits more thickly on the metallic gate structures 418. This results in faster etching of SiN over the contact structures 412 with a higher aspect ratio.

In other embodiments, the fluorinated polymer deposition gas may be $C_4F_8$, $CF_4$, $C_5F_8$, or $CH_3F$. In addition to a fluorocarbon, the fluorinated polymer deposition gas may further comprise CO, $O_2$, $CO_2$, and/or inert gasses like Ar. The CO provides more carbon deposition on top of areas with low aspect ratios than areas with high aspect ratios, which further slows the etching of SiN in low aspect ratio regions. In other embodiments, the inert bombardment gas may be another noble gas instead of Ar, such as He. However, an inert bombardment gas is limited to only noble gases. Preferably, the ratio between the flow by volume of the inert bombardment gas to the flow by volume of $H_2$ is in the range of 2:1 to 20:1. More preferably, the ratio between the flow by volume of the inert bombardment gas to the flow by volume of $H_2$ is in the range of 8:1 to 15:1. Preferably, the activation gas is fluorine free. Preferably, the bias voltage during the fluorinated polymer deposition phase and the activation phase has a magnitude of between 30 to 500 volts. More preferably, the bias voltage during the fluorinated polymer deposition phase and the activation phase has a magnitude between 30 to 500 volts. This means that the absolute value of the bias voltage is between 30 to 500 volts and more preferably between 100 to 250 volts. Various embodiments provide an aspect ratio dependent etch of SiN, which selectively etches SiN at higher depth to width aspect ratios than SiN at lower aspect ratios.

The fluorine in the fluorinated polymer is activated in order to etch $SiO_2$. The presence of $H_2$ is also needed during activation to etch SiN. Without $H_2$, the SiN will etch slowly or would not be etched. In other embodiments, $NH_3$ may be used instead of $H_2$, although $H_2$ is preferred. The amount or thickness of the fluorinated polymer provides a self-limitation of the amount of etching during the activation phase. In the specification and claims atomic layer etching is defined as a self-limited etching process, such as the self-limitation of the activation process due to the limited presence of fluorinated polymer.

It has been unexpectedly found that various embodiments are able to provide small Critical Dimension etch wrap around, which allows etching around a structure and then past the structure. Preferably, the SiO is selectively etched with respect to SiGe and Si at a ratio of at least 5:1. More preferably, the SiO is selectively etched with respect to SiGe and Si at a ratio of at least 10:1. Preferably, the SiN is selectively etched with respect to SiGe and Si at a ratio of at least 5:1. More preferably, the SiN is selectively etched with respect to SiGe and Si at a ratio of at least 10:1. In various embodiments, the doped Si may be silicon doped with carbon or P-doped Si, and the doped SiGE may be doped with boron.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents that fall within the true spirit and scope of the present disclosure.

What is claimed is:

1. A method for selectively etching SiO and SiN with respect to SiGe or Si of a structure in a plasma processing chamber, comprising providing a plurality of cycles of atomic layer etching, wherein each cycle comprises:
   a fluorinated polymer deposition phase, comprising:
      flowing a fluorinated polymer deposition gas comprising a fluorocarbon gas into the plasma processing chamber;
      forming the fluorinated polymer deposition gas into a plasma, which deposits a fluorocarbon polymer layer on the structure; and
      stopping the flow of the fluorinated polymer deposition gas into the plasma processing chamber; and
   an activation phase, comprising:
      flowing an activation gas comprising an inert bombardment gas and either $NH_3$ or $H_2$ into the plasma processing chamber;
      forming the activation gas into a plasma, wherein the inert bombardment gas activates fluorine in the fluorinated polymer which with the plasma components from $H_2$ cause SiO and SiN to be selectively etched with respect to SiGe and Si; and
      stopping the flow of the activation gas into the plasma processing chamber.

2. The method, as recited in claim 1, wherein the activation gas comprises an inert bombardment gas and $H_2$.

3. The method, as recited in claim 2, wherein the activation gas is fluorine free.

4. The method, as recited in claim 3, wherein the fluorinated polymer deposition phase provides a bias voltage with a magnitude of between 30 to 500 volts and the activation phase provides a bias voltage with a magnitude of between 30 to 500 volts.

5. The method, as recited in claim 4, wherein the fluorinated polymer deposition gas further comprises CO.

6. The method, as recited in claim 5, wherein the fluorocarbon gas is $C_4F_6$ gas.

7. The method, as recited in claim 6, wherein the inert bombardment gas is Ar.

8. The method, as recited in claim 7, wherein the activation phase is self limiting dependent on a thickness of fluorinated polymer deposited, since fluorine from the fluorinated polymer is used for etching during the activation phase.

9. The method, as recited in claim 8, wherein the structure further comprises gate structures, wherein the atomic layer etching selectively etches SiO and SiN with respect to the gate structures.

10. The method, as recited in claim 9, wherein the gate structures comprise metal and wherein the fluorinated polymer preferentially deposits on the gate structures with respect to SiO and SiN.

11. The method, as recited in claim 10, wherein the fluorinated polymer preferentially deposits on lower height-to-width aspect ratio features with respect to higher height to depth aspect ratio features.

12. The method, as recited in claim 1, wherein the fluorinated polymer deposition phase provides a bias voltage with a magnitude of between 30 to 500 volts and the activation phase provides a bias voltage with a magnitude of between 30 to 500 volts.

13. The method, as recited in claim 1, wherein the fluorinated polymer deposition gas further comprises CO.

14. The method, as recited in claim 1, wherein the fluorocarbon gas is $C_4F_6$ gas.

15. The method, as recited in claim 1, wherein the inert bombardment gas is Ar.

16. The method, as recited in claim 1, wherein the activation phase is self limiting dependent on a thickness of fluorinated polymer deposited, since fluorine from the fluorinated polymer is used for etching during the activation phase.

17. The method, as recited in claim 1, wherein the structure further comprises gate structures, wherein the gate structures comprise metal, and wherein the fluorinated polymer preferentially deposits on the gate structures with respect to SiO and SiN.

18. The method, as recited in claim 1, wherein the fluorinated polymer preferentially deposits on lower height to width aspect ratio features with respect to higher height to depth aspect ratio features.

* * * * *